United States Patent
Huang et al.

(10) Patent No.: US 9,166,046 B2
(45) Date of Patent: Oct. 20, 2015

(54) SEMICONDUCTOR DEVICE AND METHOD OF MANUFACTURING

(71) Applicant: TAIWAN SEMICONDUCTOR MANUFACTURING COMPANY, LTD., Hsinchu (TW)

(72) Inventors: Tzu-Ming Huang, New Taipei (TW); Shen-Ping Wang, Keelung (TW); Lieh-Chuan Chen, Hsinchu (TW); Chih-Heng Shen, Zhubei (TW); Po-Tao Chu, New Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/181,430

(22) Filed: Feb. 14, 2014

(65) Prior Publication Data

US 2015/0236149 A1  Aug. 20, 2015

(51) Int. Cl.
*H01L 29/66* (2006.01)
*H01L 29/78* (2006.01)

(52) U.S. Cl.
CPC .................... *H01L 29/7835* (2013.01)

(58) Field of Classification Search
CPC ............... H01L 29/7835; H01L 29/8613
USPC .................................................. 257/341, 343
See application file for complete search history.

(56) References Cited

U.S. PATENT DOCUMENTS

2007/0069288 A1\* 3/2007 Takeda ...................... 257/341

\* cited by examiner

*Primary Examiner* — Tan N Tran
(74) *Attorney, Agent, or Firm* — Hauptman Ham, LLP

(57) ABSTRACT

A semiconductor device includes a gate structure, and a source region and a drain region on opposite sides of the gate structure. The source region comprises a first region of a first conductivity type, and a second region of a second conductivity type, the second conductivity type opposite to the first conductivity type. The first region is arranged between the second region and the gate structure. The second region comprises at least one projection protruding into the first region and toward the gate structure.

20 Claims, 7 Drawing Sheets

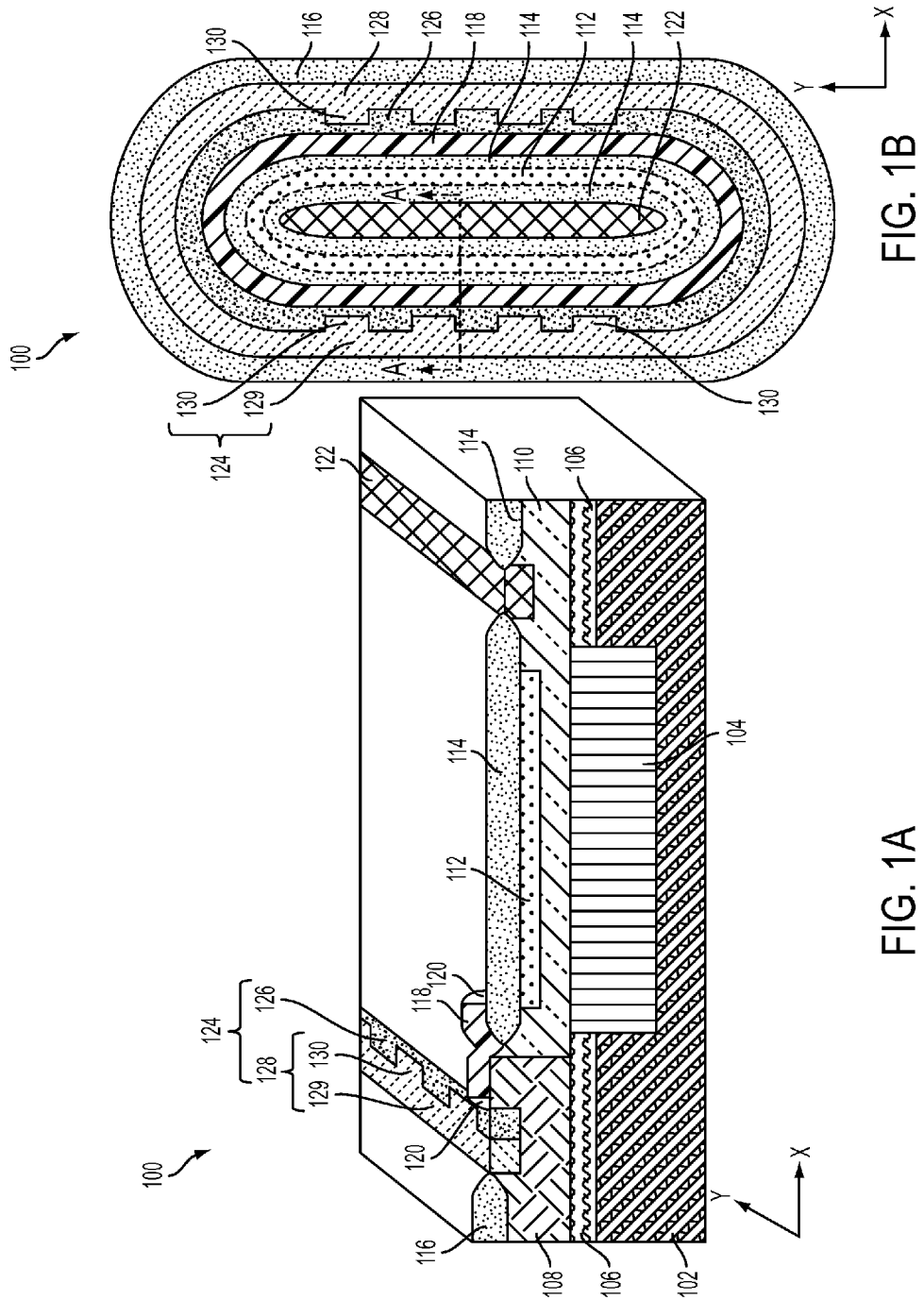

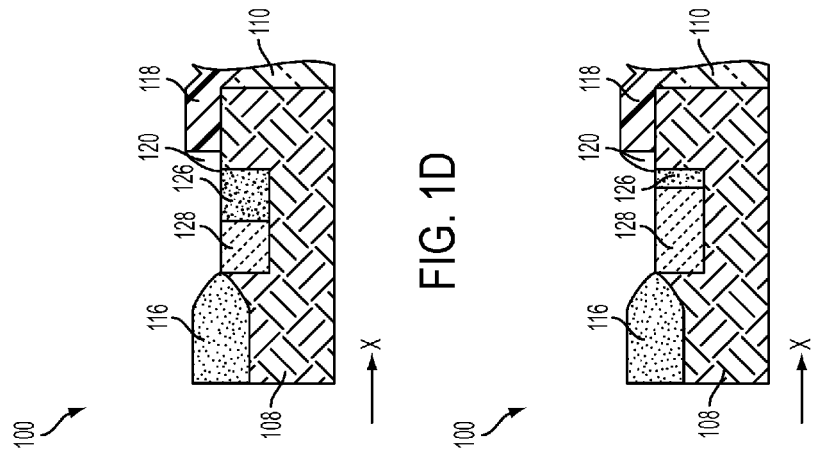
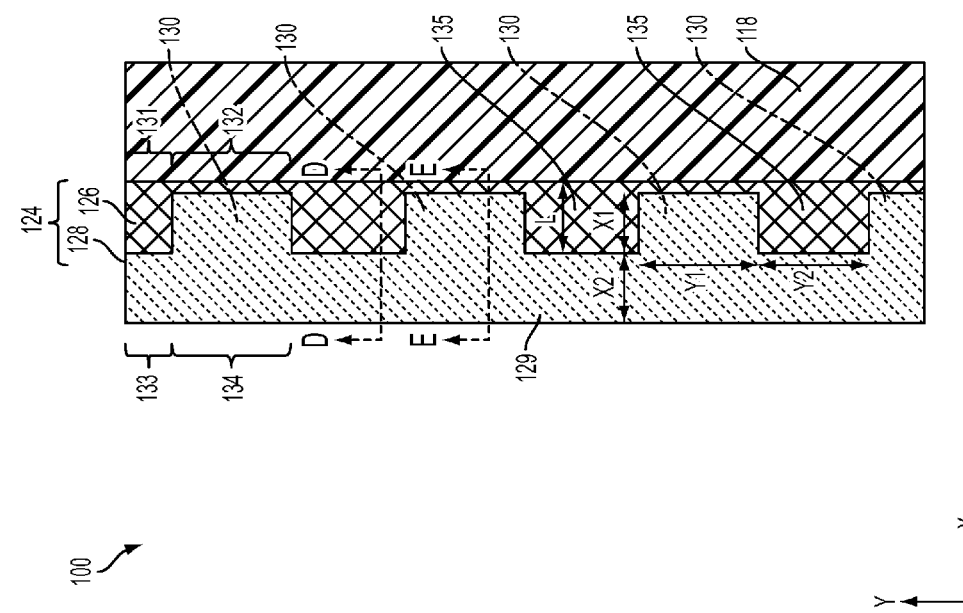

SEMICONDUCTOR DEVICE AND METHOD OF MANUFACTURING

BACKGROUND

The present disclosure relates generally to semiconductor technology, and more particularly, to semiconductor devices and manufacturing methods.

The recent trend in miniaturizing integrated circuits (ICs) has resulted in smaller devices which consume less power and have higher operating voltage, yet provide more functionality at higher speeds than before. For example, as semiconductor devices, such as metal-oxide-semiconductor field-effect transistors (MOSFETs), are adapted for high voltage applications, high voltage lateral diffusion metal-oxide-semiconductor devices (HV LDMOSs) and ultra-high voltage (UHV) LDMOSs are developed. For HV LDMOSs and/or UHV LDMOSs, high ON-state breakdown voltage and low ON-state resistance are design considerations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a schematic perspective cross-section view of a portion of a semiconductor device in accordance with some embodiments.

FIG. 1B is a schematic top view of a semiconductor device in accordance with some embodiments.

FIG. 1C is a schematic enlarged top view of a portion of a semiconductor device in accordance with some embodiments.

FIGS. 1D and 1E are schematic partial cross-section views of a semiconductor device in accordance with some embodiments.

DETAILED DESCRIPTION

Figure 2A:
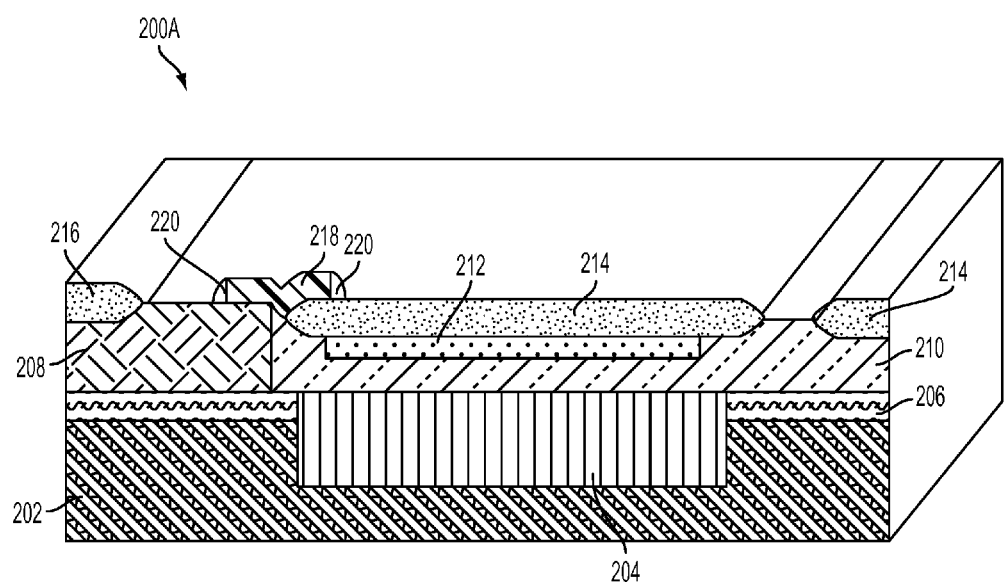
FIGS. 2A, 2B and 2C are schematic perspective cross-section views of a portion of a semiconductor device at various stages during manufacture, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A and 1B are schematic diagrams of a semiconductor device 100 in accordance with some embodiments. FIG. 1B is a schematic top view of the semiconductor device 100. FIG. 1A is a schematic perspective cross-section view, taken along line A-A in FIG. 1B, of a portion of the semiconductor device 100.

In one or more embodiments, the semiconductor device 100 comprises an active component such as a field effect transistor (FET), a FinFET transistor, a vertical channel transistor, a complementary metal-oxide-semiconductor (CMOS) transistor, a double-diffused metal-oxide-semiconductor (DMOS) transistor, a MOSFET, a high frequency transistor, or a high voltage transistor such as a HV LDMOSs or an UHV LDMOS. In the description below, UHV and/or HV LDMOSs are described. However, further embodiments are applicable to other types of semiconductor devices or active components.

The semiconductor device 100 includes a substrate 102, a pre-high-voltage well (pre-HVW) 104, an epitaxial layer 106, a first high-voltage well (HVW) 108, a second HVW 110, a ring-shaped region 112, insulating regions 114, 116, a gate structure 118, spacers 120, a drain region 122, and a source region 124. The source region 124 includes a first region 126 and a second region 128 electrically connected with each other. The pre-HVW 104, the second HVW 110, the drain region 122 and the first region 126 of the source region 124 are of a first conductivity type such as an n-type or a p-type. The substrate 102, the epitaxial layer 106, the first HVW 108, the ring-shaped region 112 and the second region 128 of the source region 124 are of a second conductivity type opposite to the first conductivity type.

In some embodiments, the semiconductor device 100 includes an n-type LDMOS, the pre-HVW 104 is an n-well, the second HVW 110 is an n-well, the drain region 122 and the first region 126 of the source region 124 are n-doped regions, the substrate 102 is a p-type substrate, the epitaxial layer 106 is a p-type epitaxial layer, the first HVW 108 is a p-well, the ring-shaped region 112 is a p-type ring, and the second region 128 of the source region 124 is a p-doped region. In some embodiments, the semiconductor device 100 includes a p-type LDMOS, the pre-HVW 104 is a p-well, the second HVW 110 is a p-well, the drain region 122 and the first region 126 of the source region 124 are p-doped regions, the substrate 102 is an n-type substrate, the epitaxial layer 106 is an n-type epitaxial layer, the first HVW 108 is an n-well, the ring-shaped region 112 is an n-type ring, and the second region 128 of the source region 124 is an n-doped region. In the description below, the semiconductor device 100 including an n-type LDMOS is described.

The substrate 102 comprises an elementary semiconductor, a compound semiconductor, an alloy semiconductor, or combinations thereof. Examples of the elementary semiconductor include, but are not limited to, silicon and germanium.

Examples of a compound semiconductor include, but are not limited to, silicon carbide, gallium arsenic, gallium phosphide, indium phosphide, indium arsenide, and indium antimonide. Examples of the alloy semiconductor include, but are not limited to, SiGe, GaAsP, AlInAs, AlGaAs, GaInAs, GaInP, and GaInAsP. Other semiconductor materials including group III, group IV, and group V elements are used in some embodiments. In one or more embodiments, the substrate 110 comprises a semiconductor on insulator (SOI), a doped epitaxial layer, a gradient semiconductor layer, and/or a stacked semiconductor structure with one semiconductor layer (e.g., Si) overlying another semiconductor layer (e.g., Ge) of a different type.

The pre-HVW 104 is formed in an upper portion of the substrate 102. In at least one embodiment, the pre-HVW 104 is an n-well formed by implanting an n-type dopant into the upper portion of the substrate 102. Example n-type dopants include, but are not limited to, phosphorous, arsenic, antimony, and combinations thereof. In at least one embodiment, the n-type dopant of the pre-HVW 104 is driven into the substrate 102 by heating the substrate 102.

The epitaxial layer 106 is formed over the substrate 102. In at least one embodiment, the epitaxial layer 106 comprises a p-type semiconductor, such as silicon, which is grown epitaxially over the substrate 102.

The first HVW 108 is formed over the epitaxial layer 106 in an area corresponding to the source region 124 and a channel region of the semiconductor device 100. In at least one embodiment, the first HVW 108 is a p-well formed by doping the epitaxial layer 106 with a p-type dopant. Example p-type dopants include, but are not limited to, boron, indium, and combinations thereof. In at least one embodiment, the first HVW 108 is referred to as a high-voltage p-well.

The second HVW 110 is formed over at least the pre-HVW 104. In an example configuration shown in FIG. 1A, the second HVW 110 further extends laterally beyond a boundary of the pre-HVW 104. In at least one embodiment, the second HVW 110 is an n-well formed by implanting an n-type dopant, such as phosphorous. The concentration of n-type dopants in the second HVW 110 is higher than in the pre-HVW 104. The second HVW 110 contacts the pre-HVW 104. The first HVW 108 is adjacent to the second HVW 110. In an example configuration shown in FIG. 1A, the first HVW 108 contacts the second HVW 110 to create a junction between the first HVW 108 and the second HVW 110. In at least one embodiment, the first HVW 108 is spaced apart from the second HVW 110.

In at least one embodiment, an n-well is formed in the second HVW 110 in an area corresponding to the drain region 122. In at least one embodiment, such an n-well is formed by implanting an n-type dopant with a concentration greater than that of the second HVW 110.

The ring-shaped region 112 is formed in an upper portion of the second HVW 110. In at least one embodiment, the ring-shaped region 112 is formed by doping the upper portion of the second HVW 110 with a p-type dopant. A depth of the ring-shaped region 112 is shallower than a depth of the second HVW 110.

The insulating region 114 is formed over the second HVW 110 and completely covers the ring-shaped region 112. The boundary of the ring-shaped region 112 is spaced inwardly from the boundary of the insulating region 114. The insulating region 116 is formed over the first HVW 108. In at least one embodiment, the insulating region 114 and/or the insulating region 116 include one or more of local oxidation of silicon (LOCOS), field oxide (FOX), or shallow trench isolation (STI) regions. In some embodiments, the insulating region 114 and/or the insulating region 116 comprise silicon oxide, silicon nitride, silicon oxynitride, other suitable materials, or combinations thereof.

The gate structure 118 bridges or spans over the first HVW 108 and the second HVW 110. A portion of the gate structure 118 is formed over the insulating region 114 and another portion of the gate structure 118 is formed over an area of the first HVW 108 adjacent the insulating region 114. In an example configuration shown in FIG. 1A, the gate structure 118 contacts both the first HVW 108 and the second HVW 110. In at least one embodiment, the gate structure 118 contacts the first HVW 108 without contacting the second HVW 110 which is completely covered by the insulating region 114. The gate structure 118 has a gate dielectric and a gate electrode over the gate dielectric. The gate dielectric is formed over a part of the insulating region 114 and extends to cover the adjacent area of the first HVW 108. The gate electrode is formed over the gate dielectric. In at least one embodiment, the gate dielectric comprises a dielectric material, a high-k dielectric material, other suitable dielectric material, or combinations thereof. Examples of a dielectric material include, but are not limited to, silicon oxide, silicon oxynitride, silicon nitride, or combinations thereof. Examples of high-k dielectric materials include, but are not limited to, HfO2, HfSiO, HfSiON, HfTaO, HfTiO, HfZrO, or combinations thereof. In some embodiments, the gate dielectric layer 121 comprises a multilayer structure. For example, the gate dielectric layer 121 comprises an interfacial layer, and a high-k dielectric material layer formed on the interfacial layer. In one or more embodiments, the gate electrode 122 is a polycrystalline silicon (polysilicon) layer or a doped polysilicon layer. In one or more embodiments, the gate electrode comprises other conductive materials, such as aluminum, copper, tungsten, metal alloys, metal silicide, other suitable materials, or combinations thereof.

The spacers 120 are formed over sidewalls of the gate structure 118. In at least one embodiment, the spacers 120 comprise silicon nitride, silicon oxide, silicon oxynitride, or combinations thereof. For simplicity and ease of visibility of other portions, the spacers 120 are illustrated in FIG. 1A at the cross-section plane, but not over the upper portion of the semiconductor device 100.

The drain region 122 and the source region 124 are formed on opposite sides of the gate structure 118. The drain region 122 is formed in a region of the second HVW 110 not covered by the insulating region 114. In at least one embodiment, the drain region 122 is formed in an n-well previously formed in the second HVW 110 as described herein. In at least one embodiment, the drain region 122 is formed by implanting an n-type dopant, such as phosphorous.

The source region 124 is formed in a region of the first HVW 108 not covered by the insulating region 114 and the insulating region 116. The source region 124 includes the first region 126 and the second region 128. The first region 126 is arranged between the second region 128 and the gate structure 118. In some embodiments, the first region 126 directly contacts the second region 128. In some embodiments, the first region 126 is physically separated from the second region 128, and the first region 126 and second region 128 are electrically connected with each other by, e.g., a contact feature. In at least one embodiment, the first region 126 of the source region 124 includes an n-doped region and the second region 128 of the source region 124 includes a p-doped region. The n-doped region and p-doped region are formed by implanting corresponding n-type and p-type dopants into the first HVW 108. In at least one embodiment, a lightly doped source (LDS) region is formed under the spacers 120 and between the first region 126 and the gate structure 118. The second region 128 has a main portion 129 and at least one projection 130 protruding from the main portion 129 toward the gate structure 118 and into the first region 126. The main portion 129 and at least one projection 130 of the second region 128 are described in greater detail herein with respect to FIG. 1C.

As indicated in the schematic top view in FIG. 1B, the semiconductor device 100 in accordance with some embodiments has an elongated oval shape. The drain region 122 is at the center of the oval shape. The insulating region 114 defines a closed loop surrounding the drain region 122. The ring-shaped region 112 also defines a closed loop surrounding the drain region 122. In FIG. 1B, inner and outer circumferential edges of the ring-shaped region 112 are illustrated in dot-dot lines to illustrate that the ring-shaped region 112 is under the insulating region 114. The gate structure 118 defines a closed loop surrounding the insulating region 114. An outer circumferential edge of the insulating region 114 is under and covered by the gate structure 118. For simplicity and ease of visibility of other portions, the spacers 120 are omitted in FIG. 1B. The source region 124 defines a closed loop surrounding the gate structure 118. The insulating region 116 defines a closed loop surrounding the source region 124 to isolate the semiconductor device 100 from other devices or components formed on the substrate 102. In at least one embodiment, the length in the Y direction of the straight sides of the elongated oval shape of the semiconductor device 100 are significantly longer, e.g., several to tens time longer, than that of the curved ends at the opposite ends of the elongated oval shape. Depending on functions and/or applications of the semiconductor device 100, the length of the straight sides of the elongated oval shape is increased or reduced. The curved edges of the elongated oval shape are circular or elliptical in at least one embodiment. In at least one embodiment, the curved edges permit the semiconductor device 100 to better utilize the corner areas compared to rectangular semiconductor devices. In at least one embodiment, the arrangement of the drain region 122 at the center and surrounded by the gate structure 118 and the source region 124 provides an improved ON-state breakdown voltage. The described shape of the semiconductor device 100 is an example. Other configurations are within the scope of various embodiments.

The first region 126 of the source region 124 defines a closed loop surrounding the gate structure 118, and the second region 128 of the source region 124 defines a closed loop surrounding the first region 126. In an example configuration shown in FIG. 1B, the main portion 129 of the second region 128 has a substantially constant width along the length of the source region 124. A plurality of projections 130 are arranged intermittently along the length of the main portion 129 and protrude toward the gate structure 118. The number and arrangement of the projections 130 along the main portion 129 as shown in FIG. 1B are examples. Other arrangements and/or number of the projection(s) 130 and/or the main portion 129 are within the scope of various embodiments. For example, although the example configuration in FIG. 1B includes the projections 130 arranged along the straight sides of the main portion 129, some embodiments additionally or alternatively include one or more projections 130 along the curved ends of the main portion 129. In another example, the example configuration in FIG. 1B includes the projections 130 arranged at a substantially constant interval along the main portion 129, some embodiments include adjacent projections 130 arranged at different intervals or spacings from each other. In a further example, although the example configuration in FIG. 1B includes substantially rectangular projections 130 of about the same size, other shapes and/or sizes of the projections 130 are within the scope of various embodiments.

FIG. 1C is a schematic enlarged top view of a portion of the semiconductor device 100 in accordance with some embodiments. For simplicity, the spacers 120 are omitted in FIG. 1C. As shown in FIG. 1C, each of the first region 126 and the second region 128 of the source region 124 has a width in the X direction along the straight sides of the semiconductor device 100, or in a direction orthogonal to a lengthwise direction of the source region 124 at the curved ends of the semiconductor device 100. The width of the second region 128 varies along the Y direction, or along the lengthwise direction of the source region 124. The width of the first region 126 also varies along the Y direction, or along the lengthwise direction of the source region 124.

The first region 126 has a first area 131 and a second area 132. The second region 128 has a third area 133 corresponding to the first area 131 of the first region 126, and a fourth area 134 corresponding to the second area 132 of the first region 126. A schematic partial cross-section view of the semiconductor device 100 in the area corresponding to the first area 131 and the third area 133 is given in FIG. 1D which is taken along line D-D in FIG. 1C. A schematic partial cross-section view of the semiconductor device 100 in the area corresponding to the second area 132 and the fourth area 134 is given in FIG. 1E which is taken along line E-E in FIG. 1C.

The width of the first region 126 in the first area 131 is greater than the width of the first region in the second area 132. The width of the second region 128 in the third area 133 is smaller than the width of the second region in the fourth area 134. In the example configuration of FIG. 1C, the third area 133 of the second region 128 with the smaller width corresponds to an area of the main portion 129 without a projection 130, and the fourth area 134 of the second region 128 with the greater width corresponds to an area of the main portion 129 with a projection 130 protruding therefrom. The first area 131 of the first region 126 with the greater width corresponds to the area of the main portion 129 without a projection 130, and the second area 132 of the first region 126 with the smaller width corresponds to the area of the main portion 129 with a projection 130 protruding therefrom. The first area 131 with the greater width defines a projection 135 protruding, relative to the second area 132 with the smaller width, toward the second region 128. As a result, the first region 126 has a plurality of projections 135 arranged alternatingly with respect to the projections 130 of the second region 128 along the length of the source region 124. The projections 135 interdigitate with the projections 130. Other arrangements for varying the width of the second region 128 and/or the first region 126 are within the scope of various embodiments.

In an LDMOS device, a parasitic bipolar junction transistor (BJT) exists. The parasitic BJT is turned ON when accumulation of minority carriers in the device reaches a sufficient high level. The accumulation of minority carriers increases with the operating voltage applied to the device. The parasitic BJT is triggered to turn ON at a voltage referred to as the ON-state breakdown voltage of the device. High ON-state breakdown voltage is a design consideration for high voltage applications.

In the semiconductor device 100, the second region 128 functions as a pick-up region for picking up minority carriers, which are holes in an n-type MOS device. By providing one or more projections 130 protruding toward the gate structure 118 and into the first region 126, the capability of the second region 128 to pick up minority carriers is increased in one or more embodiments. As a result, the accumulation of minority carriers, which triggers the turning ON of a parasitic BJT in the semiconductor device 100, does not occur until a higher voltage is applied to the semiconductor device 100. Compared to a comparative device with no projections 130, the parasitic BJT in the semiconductor device 100 in accordance with some embodiments is turned ON at a higher voltage, which means the semiconductor device 100 has a higher ON-state breakdown voltage.

In at least one embodiment, a higher ON-state breakdown voltage is achieved without increasing the device size, for example, by providing the second region 128 with one or more projections 130, without increasing the total width of the first region 126 and second region 128. This is achieved in one or more embodiments simply by modifying one or more masks for forming the first region 126 and/or the second region 128. As a result, a high ON-state breakdown voltage is obtainable without significant complication of the manufacturing process.

In at least one embodiment, a higher ON-state breakdown voltage is achieved without substantially affecting other electrical characteristics, such as OFF-state breakdown voltage, ON-state resistance, and linear drain current (Idlin) of the semiconductor device 100. As a result, in some embodiments, increased power loss, which is associated with ON-state resistance, is preventable whereas a wider safe operating area, which is associated with ON-state breakdown voltage, is obtainable at high switching speed. In at least one embodiment, high ON-state breakdown voltage and low ON-state resistance are obtainable by appropriately selecting dimensions and/or spacing of the projections 130 as described herein.

In FIG. 1C, L denotes the width of the first area 131 of the first region 126 not corresponding to a projection 130, X1 denotes the width of a projection 130, X2 denotes the width of the main portion 129, Y1 denotes the length of the projection 130, and Y2 denotes a spacing between adjacent projections 130. In at least one embodiment, one or more of the following relationships is/are satisfied:

$0.5\ L \leq X1 \leq 0.8\ L$, $0.5\ L \leq Y1 \leq 3\ L$, and $0.5\ L \leq Y2 \leq 3\ L$.

In some situations, when $X1<0.5\ L$, the projection 130 does not protrude sufficiently close to the gate structure 118, and an associated increase in the pick-up capability of the second region 128 is not sufficient to result in an intended increase in ON-state breakdown voltage. In some situations, when $X1>0.8\ L$, the projection 130 protrudes excessively close to the gate structure 118 and causes excessive electron excitation which is likely to affect one or more other electrical characteristics of the semiconductor device 100. In some embodiments, X1 and L satisfy the following relationship $0.65\ L \leq X1 \leq 0.75\ L$.

In some situations, when $Y1<0.5\ L$, a length of the projection 130 along the gate structure 118 is short and an increase in the pick-up capability of the second region 128 is not sufficient to result in an intended increase in ON-state breakdown voltage. In some situations, when $Y1>3\ L$, the long length of the projection 130 is likely to affect one or more other electrical characteristics of the semiconductor device 100. In some embodiments, Y1 and L satisfy the following relationship $0.6\ L \leq Y1 \leq 1.2\ L$.

In some situations, when $Y2<0.5\ L$, a spacing between adjacent projections 130 along the gate structure 118 is short and likely to affect one or more other electrical characteristics of the semiconductor device 100. In some situations, when $Y2>3\ L$, the spacing between adjacent projections 130 is excessive and an increase in the pick-up capability of the second region 128 is not sufficient to result in an intended increase in ON-state breakdown voltage. In some embodiments, Y2 and L satisfy the following relationship $0.6\ L \leq Y2 \leq 0.8\ L$.

In at least one embodiment, Y1=Y2. In at least one embodiment, Y1 is different from Y2. In at least one embodiment, X1=X2. In at least one embodiment, X1 is different from X2.

Figure 2B:
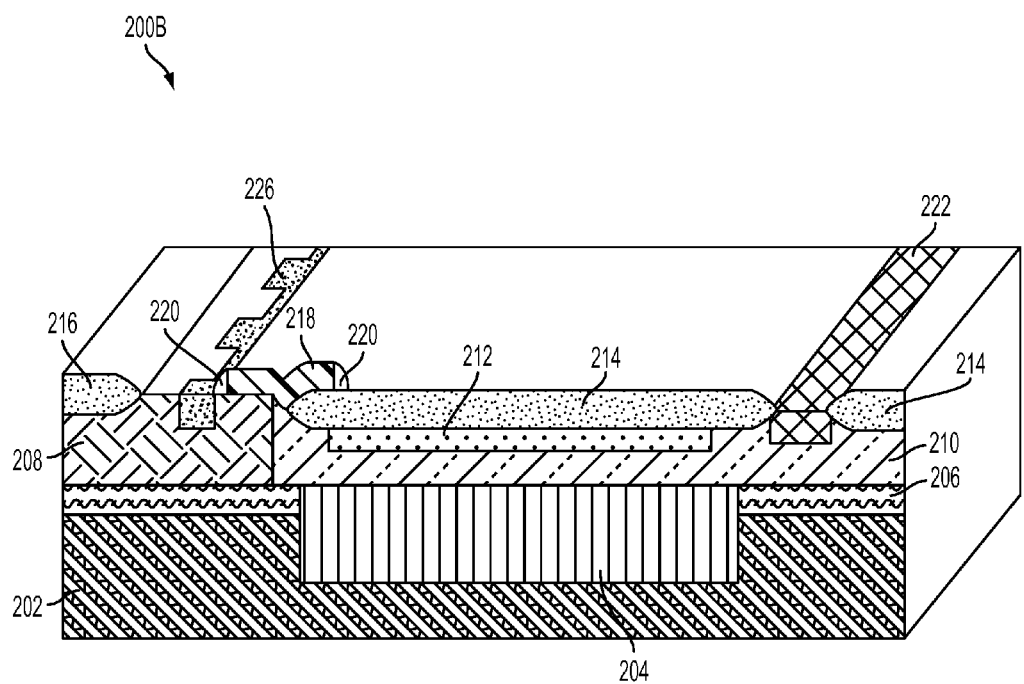
Figure 2C:
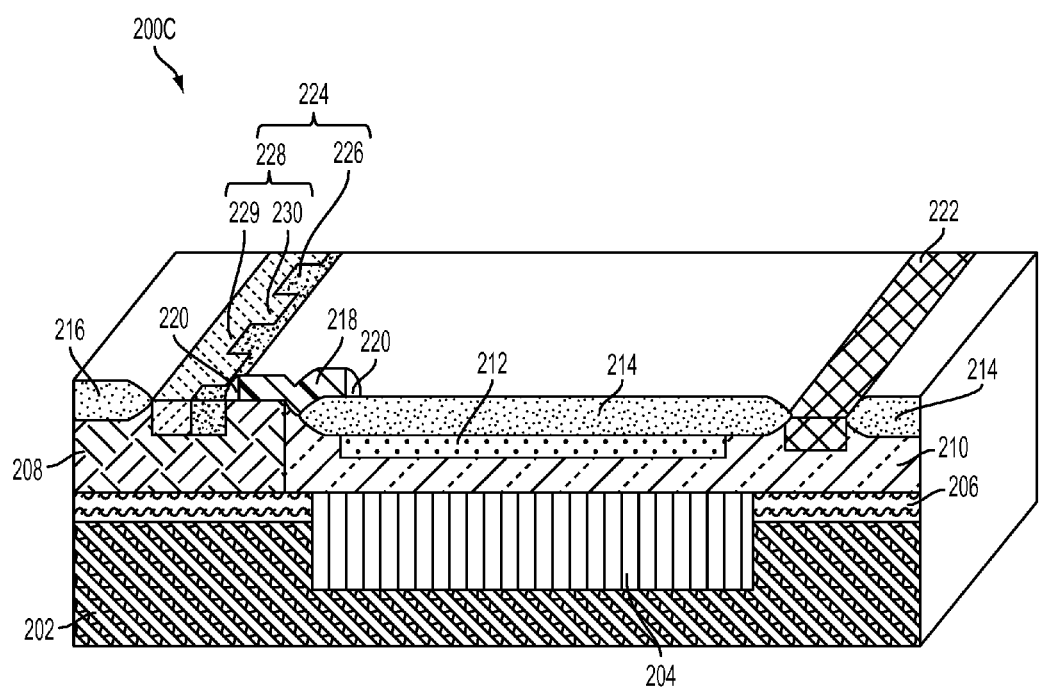

FIGS. 2A, 2B and 2C are schematic perspective cross-section views of a portion of a semiconductor device at various stages during manufacture, in accordance with some embodiments.

In FIG. 2A, a structure 200A is formed over a substrate 202 to include a pre-high-voltage well (pre-HVW) 204, an epitaxial layer 206, a first high-voltage well (HVW) 208, a second HVW 210, a ring-shaped region 212, insulating regions 214, 216, a gate structure 218, and spacers 220. In some embodiments, the substrate 202, the pre-high-voltage well (pre-HVW) 204, the epitaxial layer 206, the first high-voltage well (HVW) 208, the second HVW 210, the ring-shaped region 212, the insulating regions 214, 216, the gate structure 218, and the spacers 220 correspond to the substrate 102, the pre-high-voltage well (pre-HVW) 104, the epitaxial layer 106, the first high-voltage well (HVW) 108, the second HVW 110, the ring-shaped region 112, the insulating regions 114, 116, the gate structure 118, and the spacers 120.

For example, to form an n-type device, the manufacture begins with implanting an n-type dopant, such as phosphorous into an upper portion of the substrate 202 to form the pre-HVW 204. In at least one embodiment, the n-type dopant of the pre-HVW 204 is driven into the substrate 202 by heating the substrate 202. The epitaxial layer 206 comprising a p-type semiconductor, such as silicon, is then epitaxially grown over the substrate 202. The first HVW 208 and the second HVW 210 are sequentially formed in the epitaxial layer 206 by implantation of corresponding p-type and n-type dopants. In at least one embodiment, the first HVW 208 is formed before the second HVW 210. In at least one embodiment, the second HVW 210 is formed before the first HVW 208.

The ring-shaped region 212 is formed in the upper portion of the second HVW 210 by implantation of a p-type dopant. In at least one embodiment, the ring-shaped region 212 and the first HVW 208 have different p-type dopant concentrations and are doped sequentially or partially together. In some embodiments, the ring-shaped region 212 and the first HVW 208 are implanted separately with a p-type dopant, such as boron, using different concentrations and implant energies. In some embodiments, the first HVW 208 is formed by two implantations. In the first implantation, after forming the second HVW 210, the first HVW 208 is implanted with the ring-shaped region 212. In the second implantation, the first HVW 208 is implanted alone to result in a higher p-type dopant concentration in the first HVW 208 than in the ring-shaped region 212.

The insulating region 214, 216 are formed over the ring-shaped region 212 and a portion of the first HVW 208. In some embodiments, the insulating regions 214, 216 include a dielectric, such as silicon oxide, nitride, or other suitable insulating materials, and are formed by a thermal oxide process. For example, a patterning process is performed to protect regions where the insulating region 214, 216 are not to be formed, and then, the device being manufactured is subjected to a high temperature, for example, about 800 degrees Celsius or greater, in the presence of oxygen and, optionally, water. In some embodiments, the presence of water speeds the oxide formation process.

The gate structure 218 is formed to have a first part over the insulating region 214, a second part over the top surface of the first HVW 208, and a third part over the top surface of the second HVW 210. In at least one embodiment, the third part is omitted, and the gate structure 218 does not overlie and contact the top surface of the second HVW 210. The gate structure 218 includes a gate dielectric and a gate electrode. The formation of the gate structure 218 includes a process including photolithography patterning and etching. For example, a dielectric layer and an electrode layer are first deposited. A layer of photoresist is formed over the deposited electrode layer by a suitable process, such as spin-on coating, and then patterned to form a patterned photoresist feature by a lithography patterning method. The pattern of the photoresist is then transferred by a dry etching process to the underlying electrode layer and the dielectric layer to form the gate electrode and the gate dielectric. The photoresist layer is stripped thereafter. The spacers 220 are formed over the sidewalls of the gate structure 218. In at least one embodiment, a lightly doped source (LDS) region is formed on opposite sides of the gate structure 218 before forming the spacers 220 which overlie the LDS region.

In FIG. 2B, the drain region 222 and the first region 226 of a source region are formed over the structure 200A, by implantation of an n-type dopant, to obtain a structure 200B. In at least one embodiment, the drain region 222 and the first region 226 are formed together in the same implantation. A mask for forming the first region 226 is prepared to have a shape complementary to that of the second region 228 to be formed thereafter. For example, the first region 226 is formed to have a plurality of projections corresponding to the projections 135 described with respect to FIG. 1C. In at least one embodiment, the first region 226 and the drain region 222 are formed by separate implantations.

In FIG. 2C, the second region 228 of the source region 224 is formed over the structure 200B, by implantation of a p-type dopant, to obtain a structure 200C. A mask for forming the second region 228 is prepared to have a shape with a varying width, for example, as described with respect to FIGS. 1A-1C. In at least one embodiment, the second region 228 is formed before the first region 226 and/or the drain region 222.

In some embodiments, contact features are formed over the structure 200C. For example, the contact features are connected to the drain region 222, the source region 224 and the gate structure 218. An interlayer dielectric (ILD) material fills the space between the contact features. After the contact features are complete, interconnects are formed. The interconnects and contact features are formed of conductive materials, such as aluminum, aluminum/silicon/copper alloy, titanium, titanium nitride, tungsten, polysilicon, metal silicide, copper, copper alloy, titanium, titanium nitride, tantalum, tantalum nitride, tungsten, polysilicon, metal silicide, or combinations thereof. The interconnects are formed by a technique including chemical vapor deposition (CVD), sputtering, plating, or other suitable processes. The ILD material includes silicon oxide, fluorinated silica glass, or low dielectric constant (k) materials formed by a technique including spin-on, CVD, or other suitable processes.

Figure 3:
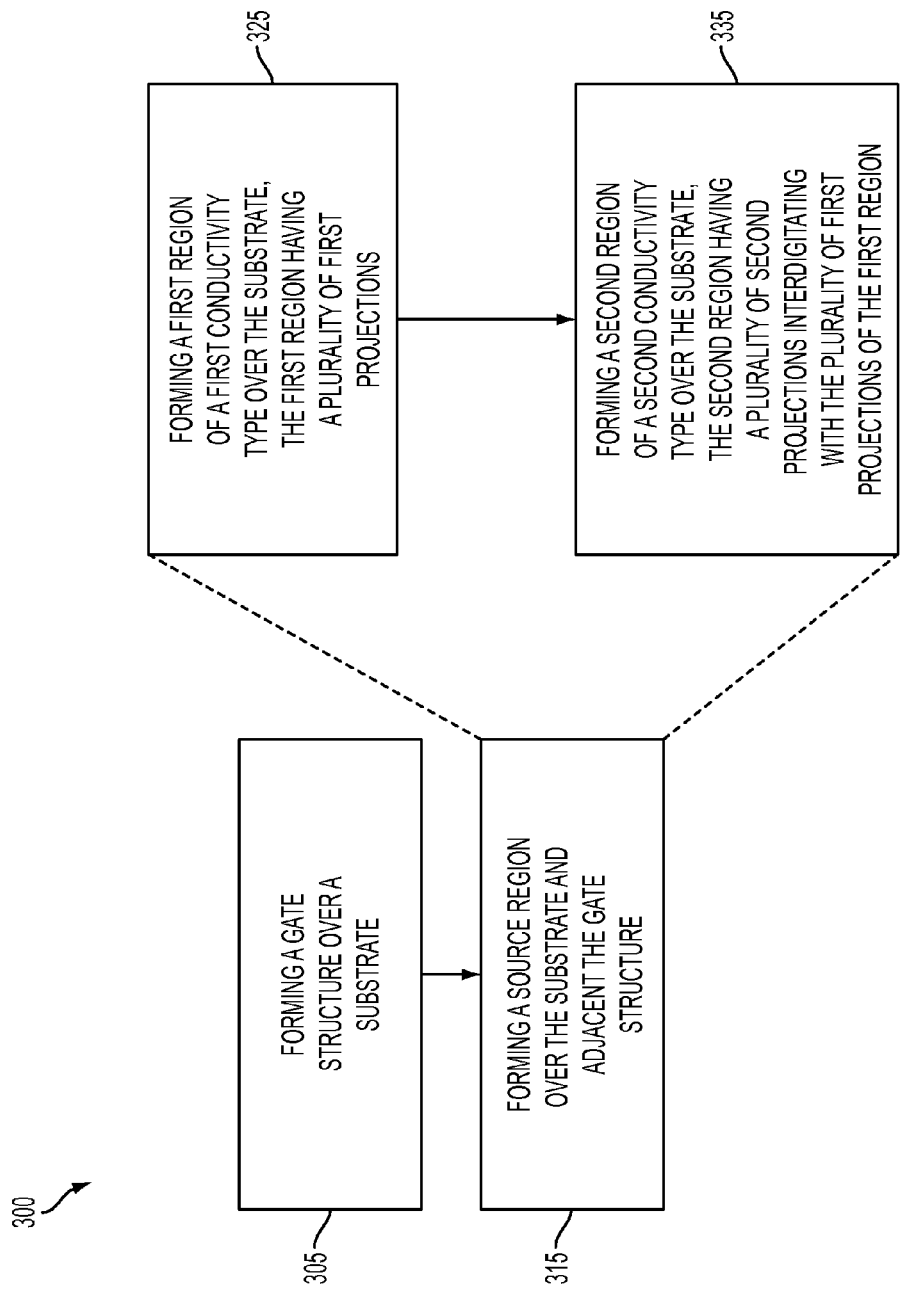
FIG. 3 is a flow chart of a process of manufacturing a semiconductor device, in accordance with some embodiments.

FIG. 3 is a flow chart of a process 300 of manufacturing a semiconductor device, in accordance with some embodiments. In at least one embodiment, the process 300 produces a semiconductor device as described with respect to FIGS. 2A-2C.

At operation 305, a gate structure is formed over a substrate. For example, a gate structure 218, with one or more other features or regions, is formed over the substrate 202 as described herein with respect to FIG. 2A.

At operation 315, a source region is formed over the substrate and adjacent the gate structure. For example, a source region 224 is formed over the substrate 202 and adjacent the gate structure 218, as described herein with respect to FIGS. 2B-2C. The operation 315 includes operations 325 and 335.

At operation 325, a first region of a first conductivity type is formed over the substrate, the first region having a plurality of first projections. For example, a first region 226 which is an n-doped region is formed over the substrate 202, and the first region 226 has a plurality of first projections 135, as described herein with respect to FIGS. 2B and 1C.

At operation 335, a second region of a second conductivity type is formed over the substrate, the second region having a plurality of second projections interdigitating with the plurality of first projections of the first region. For example, a second region 228 which is a p-doped region is formed over the substrate 202, and the second region 228 has a plurality of second projections 130 interdigitating with the plurality of first projections 135 of the first region 226, as described herein with respect to FIGS. 2C and 1C.

In at least one embodiment, operation 335 is performed before operation 325. In some embodiments, a drain region 224 is further formed over the first terminal 202, as described herein with respect to FIG. 2B.

The above method embodiment shows example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing various embodiments.

Figure 4:
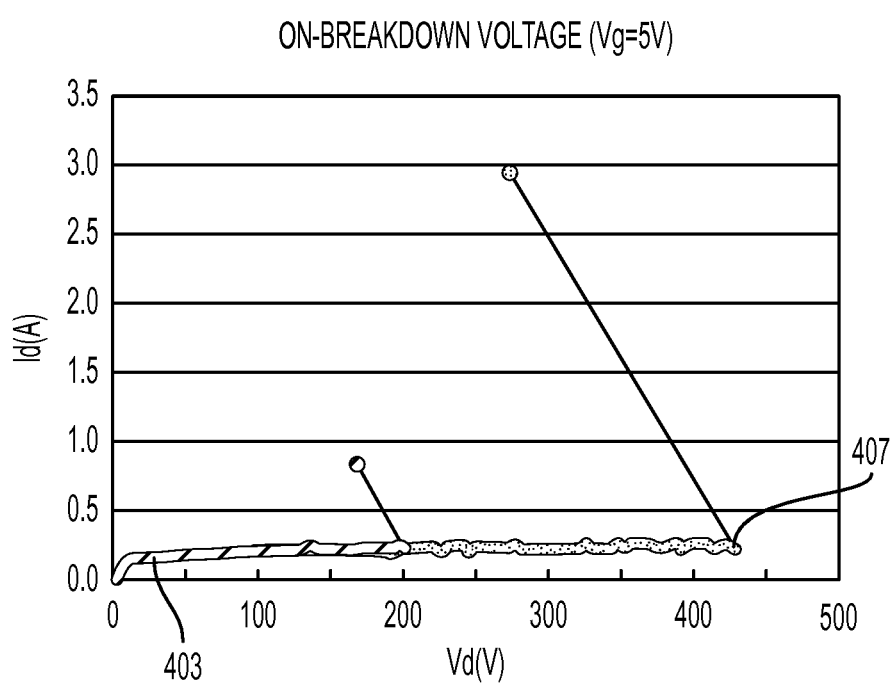
FIG. 4 includes ON-state breakdown voltage characteristics of a comparative semiconductor device and a semiconductor device in accordance with some embodiments.

FIG. 4 includes an ON-state breakdown voltage characteristic 403 of a comparative semiconductor device, and an ON-state breakdown voltage characteristic 407 of a semiconductor device having one or more projections 130 as described with respect to FIG. 1C, in accordance with some embodiments. The semiconductor devices are configured similarly, except that the comparative semiconductor device does not have projections 130, and instead has the first and second regions of substantially constant widths over the whole length of the corresponding source region. At low drain voltages Vd, the two semiconductor devices behave similarly. However, as indicated at the characteristic 403, at about 200V, the drain current Id of the comparative semiconductor device sharply increases, indicating that a parasitic BJT is turned ON and that the comparative semiconductor device reaches an ON-state breakdown voltage of about 200V. As indicated at the characteristic 407, the semiconductor device in accordance with some embodiments continues to operate properly at and well beyond 200V. The semiconductor device in accordance with some embodiments reaches an ON-state breakdown voltage of about 425V, indicating an increase of about 114% in ON-state breakdown voltage. Other electrical performances of the two semiconductor devices are not significantly different, e.g., the comparative semiconductor device has an OFF-state breakdown voltage of 820V, an ON-state resistance of 202.8 mohm/cm2, and Idlin of 3.147 mA, whereas the semiconductor device in accordance with some embodiments has an OFF-state breakdown voltage of 821V, an ON-state resistance of 203.3 mohm/cm2, and Idlin of 3.139 mA. The characteristics in FIG. 4 show that a semiconductor device in accordance with some embodiments achieves a significantly higher ON-state breakdown voltage, without significant changes in other electrical performances especially ON-state resistance.

In summary, one or more embodiments provide a semiconductor device with a source region having first and second regions of opposite conductivity types. The first region is arranged between the second region and gate structure. The second region has at least one projection protruding into the first region and toward the gate structure. As a result, in at least one embodiment, the ON-state breakdown voltage is increased without affecting other electrical performances, especially ON-state resistance. One or more of the described effects is obtainable in one or more embodiments without increasing the device size and/or complex modification to the manufacturing process.

In some embodiments, a semiconductor device comprises a gate structure, and a source region and a drain region on opposite sides of the gate structure. The source region comprises a first region of a first conductivity type, and a second region of a second conductivity type, the second conductivity type opposite to the first conductivity type. The first region is arranged between the second region and the gate structure. The second region comprises at least one projection protruding into the first region and toward the gate structure.

In some embodiments, a semiconductor device comprises a gate structure, and a source region and a drain region on opposite sides of the gate structure. The source region comprises a first region of a first conductivity type and a second region of a second conductivity type, the second conductivity type opposite to the first conductivity type. The first region is arranged between the second region and the gate structure. The second region has a width varying along a length of the source region.

In a method of manufacturing a semiconductor device in accordance with some embodiments, a gate structure is formed over a substrate. A source region is formed over the substrate and adjacent the gate structure. The formation of the source region comprises forming a first region of a first conductivity type over the substrate, and forming a second region of a second conductivity type over the substrate. The first region has a plurality of first projections. The second region has a plurality of second projections interdigitating with the plurality of first projections of the first region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure; and
   a source region and a drain region on opposite sides of the gate structure;
   wherein
   the source region comprises a first region of a first conductivity type and a second region of a second conductivity type, the second conductivity type opposite to the first conductivity type,
   the first region is arranged between the second region and the gate structure, and
   the second region has a width varying along a length of the source region.

2. The semiconductor device of claim 1, wherein the first region has a width varying along the length of the source region.

3. The semiconductor device of claim 2, wherein
   the first region has first and second areas,
   the width of the first region in the first area is greater than in the second area,
   the second region has a third area corresponding to the first area of the first region, and a fourth area corresponding to the second area of the first region, and
   the width of the second region in the third area is smaller than in the fourth area.

4. The semiconductor device of claim 1, further comprising:
   a first well of the second conductivity type, the first region and second region formed in the first well.

5. The semiconductor device of claim 4, further comprising:
   a second well of the first conductivity type, the drain region formed in the second well, and the gate structure bridging the first and second wells.

6. The semiconductor device of claim 5, further comprising:
   a ring-shaped region of the second conductivity type in the second well; and
   an insulating region over the ring-shaped region and under a portion of the gate structure.

7. The semiconductor device of claim 6, wherein the source region defines a closed loop surrounding the drain region.

8. The semiconductor device of claim 1, wherein the second region comprises a plurality of projections protruding into the first region and toward the gate structure.

9. The semiconductor device of claim 8, wherein the plurality of projections is arranged intermittently along a length of the source region.

10. The semiconductor device of claim 9, wherein $0.5 L \leq X1 \leq 0.8 L$, where
    X1 is a width of at least one of the plurality of projections, and
    L is a width of the first region in an area not corresponding to the plurality of projections.

11. The semiconductor device of claim 10, wherein $0.5 L \leq Y1 \leq 3 L$,
    where Y1 is a length of at least one of the plurality of projections.

12. The semiconductor device of claim 11, wherein $0.5 L \leq Y2 \leq 3 L$,
    where Y2 is a spacing between at least one pair of adjacent projections among the plurality of projections.

13. The semiconductor device of claim 8, wherein
    the first region of the first conductivity type includes an n-type region,
    the second region of the second conductivity type includes a p-type region, and
    the drain region includes a further n-type region.

14. The semiconductor device of claim 8, wherein
    the first region of the first conductivity type includes a p-type region,
    the second region of the second conductivity type includes an n-type region, and
    the drain region includes a further p-type region.

15. The semiconductor device of claim 8, wherein the first region has a plurality of first projections, the second region has a plurality of second projections, and the plurality of first projections interdigitate with the plurality of second projections.

16. A semiconductor device, comprising:
a gate structure; and
a source region and a drain region on opposite sides of the gate structure;
wherein
the source region comprises a first region of a first conductivity type and a second region of a second conductivity type, the second conductivity type opposite to the first conductivity type,
the first region is arranged between the second region and the gate structure, and
the first region has a shape varying along a length of the source region.

17. The semiconductor device of claim 16, wherein
the first region of the first conductivity type includes an n-type region,
the second region of the second conductivity type includes a p-type region, and
the drain region includes a further n-type region.

18. The semiconductor device of claim 16, wherein
the first region of the first conductivity type includes a p-type region,
the second region of the second conductivity type includes an n-type region, and
the drain region includes a further p-type region.

19. The semiconductor device of claim 16, wherein the first region has a plurality of first projections, the second region has a plurality of second projections, and the plurality of first projections interdigitate with the plurality of second projections.

20. A semiconductor device, comprising:
a gate structure; and
a source region and a drain region on opposite sides of the gate structure;
wherein
the source region comprises a first region of a first conductivity type and a second region of a second conductivity type, the second conductivity type opposite to the first conductivity type,
the first region is arranged between the second region and the gate structure,
the first region and the second region having a variable width, and
the first region has a plurality of first projections, the second region has a plurality of second projections, and the plurality of first projections interdigitate with the plurality of second projections.

* * * * *